(12) United States Patent
Boland, II et al.

(10) Patent No.: US 7,030,616 B1
(45) Date of Patent: *Apr. 18, 2006

(54) UNDERWATER CABLE LOCATING DEVICE

(75) Inventors: John K. Boland, II, Dover, DE (US); Hossein Eslambolchi, Los Altos Hills, CA (US); John Sinclair Huffman, Conyers, GA (US)

(73) Assignee: AT&T Corp., New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/881,631

(22) Filed: Jun. 30, 2004

Related U.S. Application Data

(63) Continuation of application No. 10/163,954, filed on Jun. 6, 2002, now Pat. No. 6,859,037.

(51) Int. Cl.
*G01V 3/10* (2006.01)

(52) U.S. Cl. ......................................... 324/329; 324/67

(58) Field of Classification Search ............ 324/66–67, 324/228, 232, 326–327, 329, 539, 541, 543, 324/544

See application file for complete search history.

(56) References Cited

U.S. PATENT DOCUMENTS

| | | | |
|---|---|---|---|
| 3,301,132 A * | 1/1967 | Lehmann et al. ............ 89/1.81 |
| 3,381,485 A * | 5/1968 | Crooks et al. ............... 405/191 |
| 3,516,488 A * | 6/1970 | Castela et al. ............... 166/359 |
| 4,932,350 A | 6/1990 | Takimoto .................... 114/330 |
| 5,438,265 A | 8/1995 | Eslambolchi et al. ....... 324/326 |
| 5,644,237 A | 7/1997 | Eslambolchi et al. ....... 324/326 |
| 5,764,061 A * | 6/1998 | Asakawa et al. ........... 324/326 |
| 5,798,644 A | 8/1998 | Eslambolchi et al. ....... 324/326 |
| 5,990,809 A | 11/1999 | Howard ...................... 340/998 |
| 6,859,037 B1 * | 2/2005 | Boland et al. .............. 324/329 |

* cited by examiner

*Primary Examiner*—Bot Ledynh
*Assistant Examiner*—Reena Aurora

(57) ABSTRACT

An apparatus for locating a buried utility conveyance, such as an undersea cable, beneath a body of water. The apparatus generally comprises a submersible housing that contains a variable ballast system for selectively controlling the buoyancy of the apparatus, operator-controlled maneuvering apparatus, and a detector assembly for locating the conveyance. The detector assembly includes first and second signal generators and first and second signal detectors for vectoring the location of the conveyance. An operator guides the detector relative to a target search location through cables attached to the housing and the variable ballast system. A camera generates images of the target search location for use by the operator to control the apparatus through an umbilical cable connected to the housing.

8 Claims, 5 Drawing Sheets

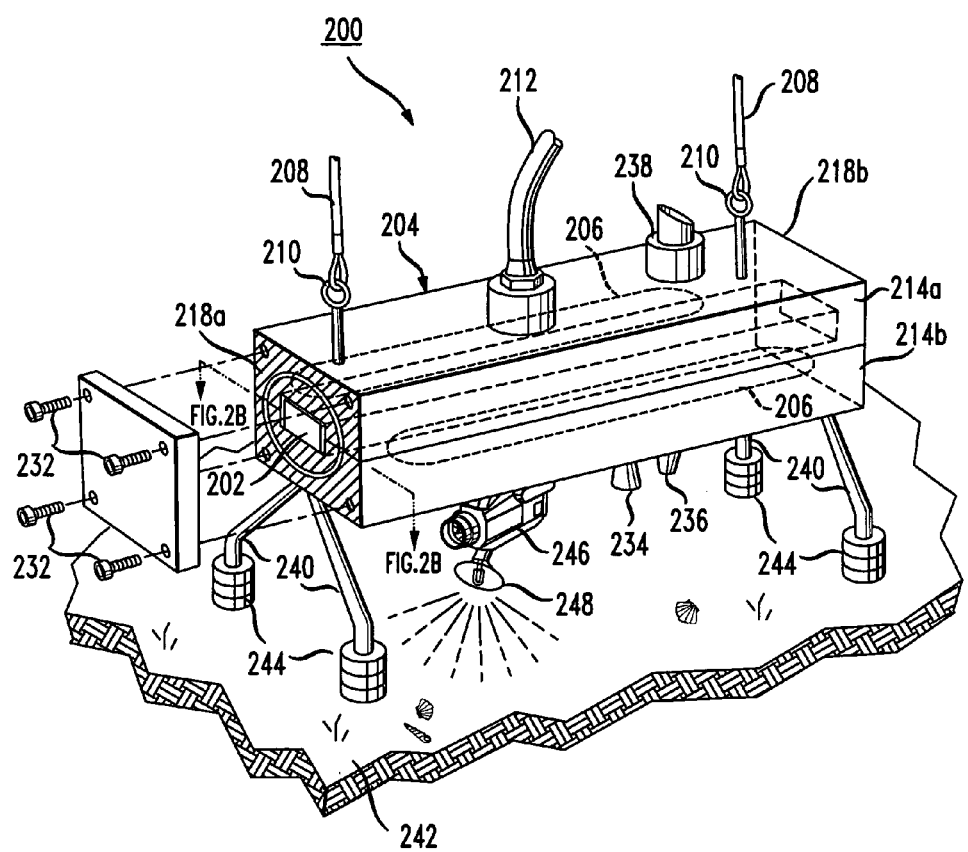

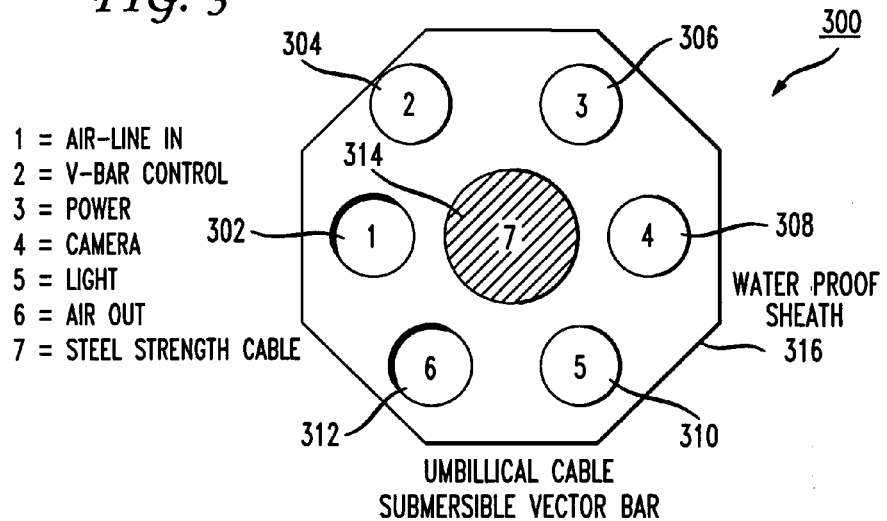
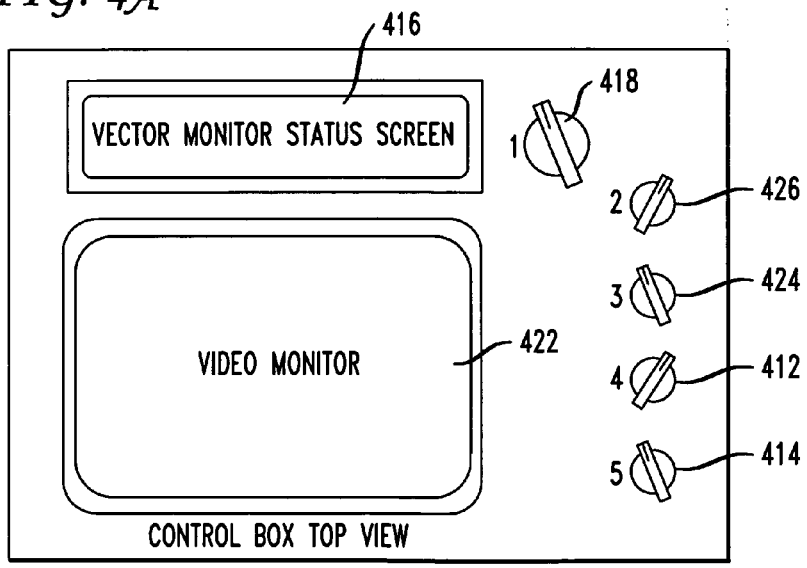

UNDERWATER CABLE LOCATING DEVICE

CROSS-REFERENCE TO RELATED APPLICATION

This application is a continuation of application Ser. No. 10/163,954, filed Jun. 6, 2002 and entitled UNDERWATER CABLE LOCATING DEVICE WITH CONTROLLED BUOYANCY, which issued on Feb. 22, 2005 as U.S. Pat. No. 6,859,037.

FIELD OF THE INVENTION

The present invention relates generally to locating buried objects, and more particularly, to a method and apparatus for locating pipes, cables and the like, that are disposed underwater, either on or beneath the sea floor.

BACKGROUND

Utilities bury their pipes and/or cables (hereinafter "conveyances") underground for many reasons, including protection from the elements, aesthetics, and the like. Such conveyances may be buried in the sea floor, deep beneath the surface of the water. To enable the buried conveyance to be located in the future, the utility typically records the location on a map. Contractors who are seeking to excavate in the vicinity of a buried conveyance must know the precise location of the conveyance to avoid damaging the conveyance or any peripheral components during the excavation. Since most maps do not provide enough detail to accurately locate a buried utility conveyance, several approaches have been proposed using radio frequency (RF) devices.

In a known method for locating a buried utility conveyance, an alternating current is impressed on a metallic portion of the conveyance or onto a separate associated conductor. A technician seeking to locate the conveyance utilizes a receiver to detect the signal radiated by the conveyance in response to the impressed signal. An improvement on this practice is disclosed in U.S. Pat. No. 5,644,237, assigned to the present assignee (AT&T Corp.) and incorporated by reference herein. This device utilizes a locating signal (tone) that comprises an RF signal at a frequency specific to the utility responsible for the conveyance of interest. The confirmation signal (tone) comprises a near DC signal that is pulsed in a particular manner unique to the conveyance of interest. To generally locate a particular conveyance, a technician utilizes a first detector for detecting the locating signal. After the general location is determined, the conveyance is precisely located with a second detector by detecting the strength of the confirmation signal.

U.S. Pat. No. 5,798,644, assigned to the present assignee (AT&T Corp.) and incorporated by reference herein, discloses a method and apparatus for locating buried conveyances that are spaced in close proximity to one another. Specifically, the '644 patent discloses a device which impresses a first (conveyance locating) signal, and a second (conveyance-confirmation) signal at a low frequency on the conveyance. The first signal causes the conveyance to radiate a first magnetic field. The conveyance-confirmation signal is pulsed in a particular pattern unique to the conveyance, causing it to radiate a second magnetic field unique to the conveyance. A first sensor senses the first magnetic field to locate the region of greatest strength for the first magnetic field, thereby identifying the region where the conveyance is generally disposed. An array of second sensors (magnetometers) are utilized to find the second magnetic field within the region where the first magnetic field is of greatest strength. A processor determines the location of the conveyance by vectoring signals from the second sensors caused by the second magnetic field.

SUMMARY OF THE INVENTION

In accordance with an aspect of the invention, an apparatus is provided for locating a utility conveyance beneath a body of water. The apparatus generally comprises a submersible housing that contains a variable ballast system for selectively controlling the buoyancy of the apparatus, and a detector assembly for locating the conveyance. The detector assembly includes a first signal generator for impressing a conveyance-locating signal on the conveyance so that the conveyance radiates a first electromagnetic field, and a second signal generator for impressing a conveyance-confirmation signal that is pulsed in a particular pattern unique to the conveyance to be located, so that the conveyance radiates a second electromagnetic field unique to the conveyance. The detector further includes a first signal detector for sensing where the first field is strongest to establish a region where the conveyance is generally located, and a plurality of second detectors, each of the second detectors being capable of detecting the presence of the second field. A processor is connected to the plurality of second detectors for vectoring the location of the conveyance in response to the presence of the second field detected at each of the second detectors. An operator can manually manipulate the apparatus to guide the detector relative to a target search location through cables attached to the housing. The variable ballast system is connected via an umbilical cable to a remote air and vacuum supply associated with a control box at the operator's location to enable the apparatus to be submerged beneath the surface of the water and subsequently raised. A camera is provided on or in the housing to generate images of the target search area that are directed to the control box through the umbilical cable.

The present invention will now be described in detail with particular reference to the accompanying drawings.

BRIEF DESCRIPTION OF THE DRAWINGS

FIG. 2A is a an exploded isometric view depicting a schematic of a submersible housing;

FIG. 3 is a cross-sectional view of an umbilical cable;

FIG. 4A is a schematic view of a control box from one side;

DETAILED DESCRIPTION OF THE PREFERRED EMBODIMENT

Figure 1:
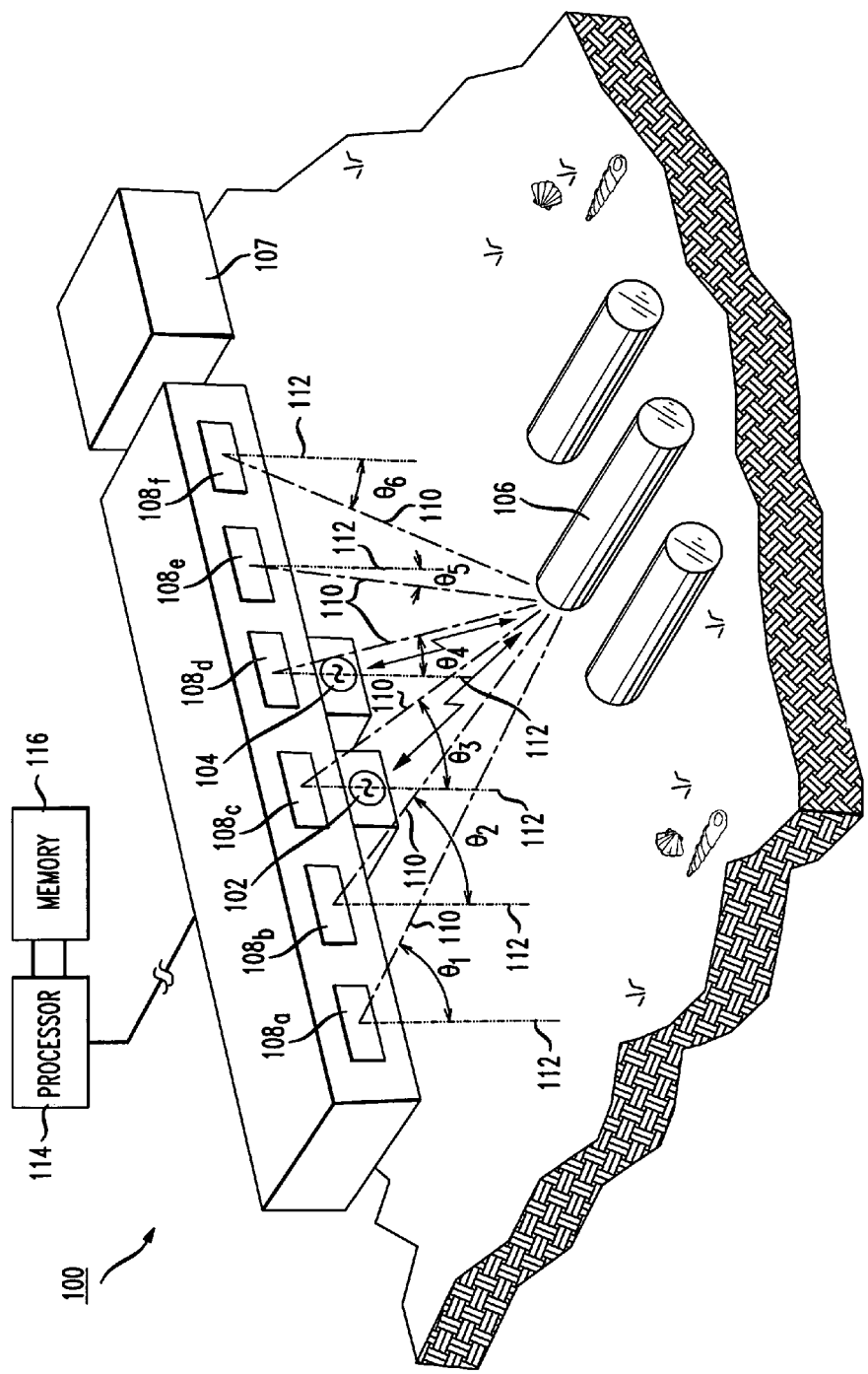
FIG. 1 is a schematic of a detector assembly.

Referring now to the several views of the drawings, there is depicted an apparatus for locating a conveyance submerged beneath a sea, lake or pond floor. The apparatus comprises a detector as disclosed in the '644 patent discussed above. As shown schematically in FIG. 1, the detector assembly 100 includes a first signal generator 102 and a second signal generator 104. The first signal generator 102 impresses a first alternating current on a conveyance 106 in the RF range at a frequency that is unique to the utility responsible for the conveyance 106. For example, AT&T uses 220 and 440 Hz as its conveyance-locating frequencies. Other utilities use different frequencies. The second signal generator 104 impresses a second signal (referred to as a conveyance-confirmation signal), which constitutes a near DC signal that is pulsed in a particular manner unique to the conveyance 106. The signal generators 102 and 104 are depicted in FIG. 1 as separate units. Alternatively, a single device can be employed to generate both signals. For example, the LMS 3 signal generator, manufactured by Radiodetection Ltd. (Radiodetection) of the United Kingdom, could be readily employed to generate the conveyance-locating and conveyance-confirmation signals as discussed above.

The detector assembly 100 further includes a first sensor 107 (e.g., PDL3 receiver manufactured by Radiodetection) for detecting the first magnetic field radiated by the conveyance 106. The second magnetic field radiated by the conveyance 106 is detected by an array of sensors 108a–f. Each sensor 108 consists of a magnetometer tuned to the frequency of the second magnetic field radiated by the conveyance 106. The sensors 108a–f are disposed in a spaced relationship along a longitudinal axis of the array. The magnetic field lines representing the field radiated by the conveyance are shown at 110. The angle between the field lines 110 and a central axis 112 of each sensor 108 is shown as $\theta_{1-6}$. These sensors are coupled to a processor 114 and associated memory 116. The processor 114 utilizes data from each sensor in the array 108a–f representing the field strength and azimuth of the radiated field from the conveyance relative to each sensor, and generates a matrix of the field strength and azimuth to establish the precise location of the conveyance as taught in the '644 patent.

Figure 2B:
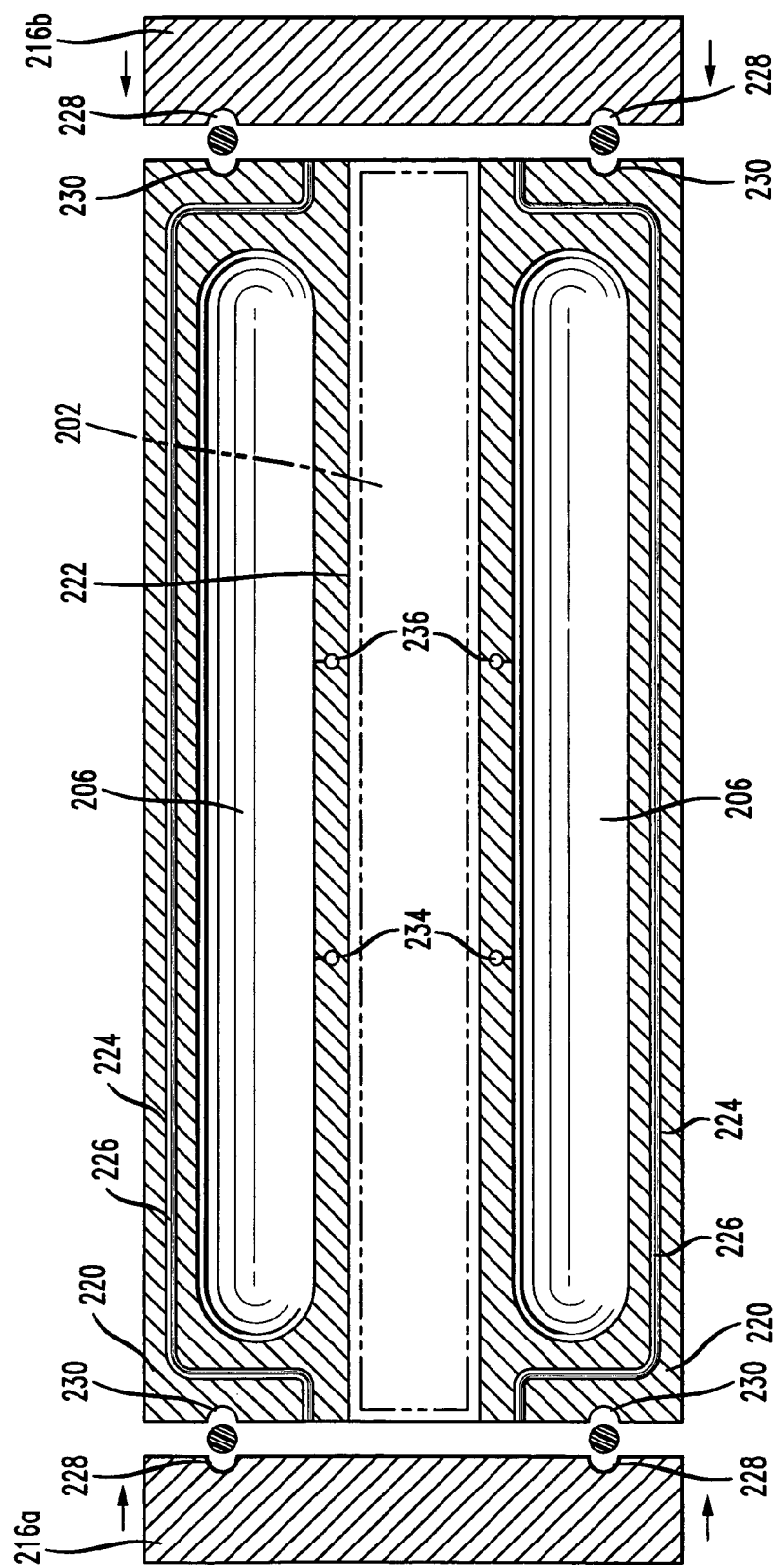
FIG. 2B is a cross-sectional view along lines 2B—2B in FIG. 2A.

Referring now to FIGS. 2A and 2B, there is depicted an underwater conveyance locating apparatus (UCLA) 200 comprising a detector assembly 202 (see FIG. 1) and waterproof housing 204. In this implementation, the detector assembly 202 does not include the processor, which is remotely located in a control box as described in more detail below. The housing 204 includes a plurality of cylinders 206 that fluidly communicate with air and water from outside the housing to selectively control the buoyancy of the entire assembly so that the housing can be submerged to the sea floor beneath a body of water and subsequently elevated to the surface. A plurality of control cables 208 are connected to the housing with appropriate fittings generally represented by the reference numeral 210 to facilitate movement of the apparatus 200 when searching for a buried conveyance. The control cables 208 enable an operator from a remote location (e.g., a boat) to move the housing around beneath the surface of the water. An umbilical cable 212 is connected to the top of the housing in the exemplary embodiment. The umbilical cable contains a plurality of conduits as shown in FIG. 3 for controlling various functions of the UCLA 200, including ballast for the housing, power for the detector, illumination of the underwater surface, and photography to assist in guiding the housing.

The housing 204 in the exemplary embodiment comprises a pair of mating half sections 214a, 214b, and a pair of end plates 216a, 216b. Each half section 214a, 214b, generally comprises a first end face 218a and a second end face 218b, and a pair of elongated flanges 220. An elongated cutout 222 is defined along a central axis of each half section to accomodate the detector assembly 100 (see FIG. 1). A plurality of cutouts 206 may be provided in the flanges to form at least one integral water ballast tank for controlling the buoyancy of the assembly. In the illustrative embodiment depicted in the drawings, a pair of water ballast tanks are formed by mating cutouts 206 in each half of the housing. Alternatively, the ballast tanks may be implemented as separate components that are mounted or affixed to a portion of the housing 204. Each half section 214a, 214b has a pair of grooves 224 that extend along the length of each half 214a, 214b, for receiving an O-ring or the like 226 to seal the opposed half sections when assembled. Alternatively, only one of the half sections 214a, 214b can be provided with a groove such that the O-ring seats within the single groove and against the flat surface of the opposing half section (not shown). Each end plate 216a, 216b is provided with a circumferential groove that mates with an opposing circumferential groove 230 defined in the first end face and the second end face of the assembly formed after joining the half sections, respectively, to provide a water tight seal between the end plates 216a, 216b and the half sections 214a, 214b. The plates 216a, 216b are bolted to the half sections with fasteners as shown. The water ballast tanks enable the buoyancy of the assembly to be controlled by pumping water into and out of the tanks. Air is injected into and withdrawn from the tanks through the umbilical cable 212. The tanks are coupled via plumbing to a first check valve 234, which permits water to flow into the tanks, and a second check valve 236, through which water can flow out of the tanks. An exhaust or relief valve 238 is connected to the tanks to relieve excess pressure. It will be appreciated by those skilled in the art that the structure of the housing 204 can embody many different arrangements, and that the embodiment depicted and described herein is intended to be exemplary.

In the exemplary embodiment, the housing 204 includes a plurality of legs 240 for supporting the UCLA 200 above the sea floor depicted generally at 242. Each leg 240 can be configured to receive a plurality of weighted feet 244. Additional weights can be added or removed as desired to respectively increase or decrease the buoyancy of the UCLA 200. Alternatively, weights can be attached to the body of the housing 204 with a support structure. The housing 204 further contains an illumination source 246 and a video camera 248 for sending images of the target search area to the operator. These images are communicated to a control box via an umbilical cable as described below.

Referring now to FIG. 3, there is shown a cross-sectional view of an umbilical cable 300 that joins the control box (see FIG. 4) to the housing. In the exemplary embodiment, the umbilical cable 300 includes seven conduits for an air supply 302, detector assembly controls 304, power 306, camera control 308, light control 310, air out (suction) 312 and a steel cable 314 for strength. The conduits for air-in and vacuum are connected to the ballast tanks in the housing. A waterproof sheath 316 is provided on the outside of the cable. It will be appreciated by those skilled in the art that the umbilical cable 300 can be modified to encompass many different structural embodiments.

Figure 4B:
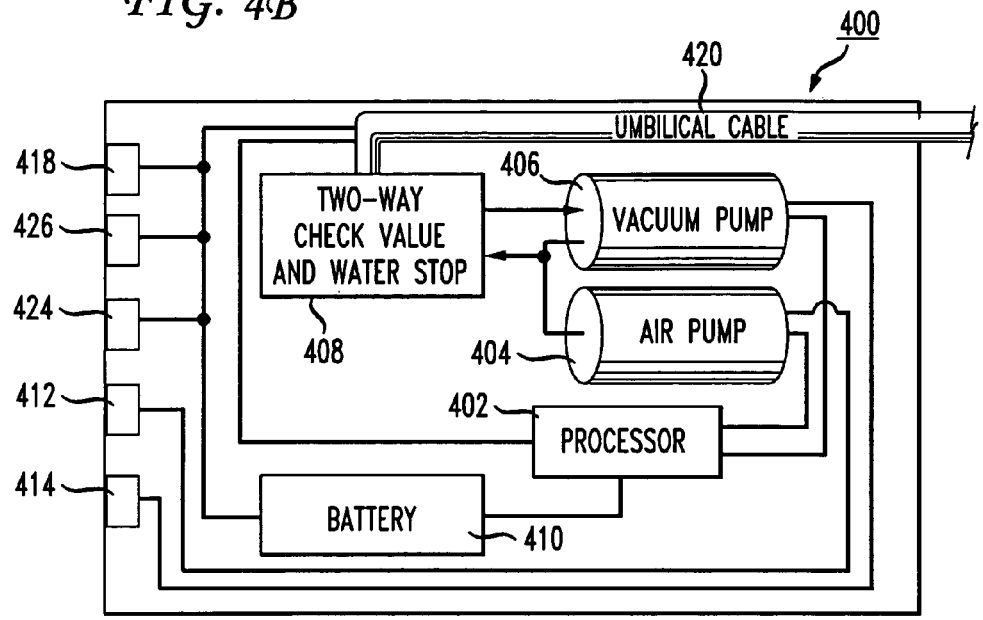
FIG. 4B is a schematic view of the control box from the inside.

With reference to FIGS. 4A and 4B, the control box 400 includes a processor 402 for controlling a variety of functions relating to the detector. The control box 400 further includes a pneumatic assembly comprising at least one positive pressure air pump 404 and a vacuum pump 406. The air pump 404 and vacuum pump 406 are coupled to a two-way check valve and water stop shown schematically at 408. This valve is coupled to the umbilical cable such that the conduits for air-in and air-out respectively communicate with the air pump 404 and the vacuum pump 406. The processor 402 and pumps 404, 406 are connected via an electrical bus to an internal power source such as a battery 410 or an external power source (not shown). The air pump is connected to a switch 412, and the vacuum pump is connected to a switch 414 as shown schematically in FIG. 4A. The control box 400 includes a detector status screen 416 that presents graphic or pictorial information to the operator relating to the location of the conveyance based upon the output from the processor 402 in accordance with the teachings of the '644 patent as discussed above. The status screen 416 can also be adapted to display various parameters such as water temperature and the like based upon inputs from sensors installed on the housing if desired. Power is directed to the detector assembly in the housing through a switch 418 and the umbilical cable 420. A video monitor 422 is located on the control box near the detector status screen 416, to enable the operator to view the area underwater in proximity to the apparatus through the camera attached to the housing. The camera is controlled with a switch 424. Illumination of the target area through lighting mounted on the housing is controlled with a switch 426.

The UCLA 200 (see FIG. 2) is submerged beneath the surface of the water by energizing the vacuum pump 406. This action enables water to flow through the water inlet check valve 234 (see FIGS. 2A and 2B) and into the ballast tanks 206, thereby providing the UCLA with negative buoyancy. The weighted legs 240 attached to the housing assist in lowering the assembly beneath the surface of the water. Once submerged, the UCLA 200 can be manipulated into a target search area with the maneuvering ropes 208 as described above. The detector assembly 202 within the housing is then energized to first generally locate the buried conveyance by sensing the first field, and to then fine-tune the location by processing field data obtained from the array of second sensors as described above. This information is presented on the status screen 416. The UCLA 200 (see FIG. 2) is raised from the sea floor by energizing the air pump 404 to pressurize the ballast tanks 206 (FIG. 2) and blow out the water ballast through the one-way air valve 236 in the housing.

Figure 5:
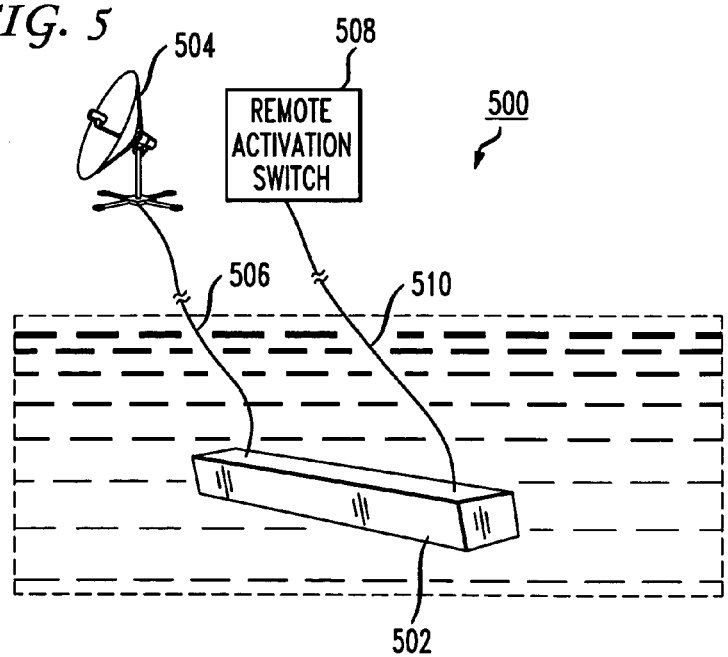
FIG. 5 is a schematic view of a detector assembly encapsulated in a waterproof sheath in accordance with an alternative embodiment of the invention.

Referring now to FIG. 5, there is depicted an alternative embodiment of a UCLA that is adapted for use in shallow bodies of water, such as creeks, streams and the like. In this embodiment, a variable ballast system is not required. The assembly 500 has enough weight, or is provided with additional weight(s), so that sufficient negative buoyancy enables the assembly 500 to be submerged beneath the water surface. The detector assembly 500 is encapsulated in a water-proof sheath 502. A remote antenna 504 is connected to the detector assembly at 506 for communicating cable location data to a portable data link (not shown). A remote activation switch 508 is provided for turning the detector assembly on and off. The switch is shown schematically and is connected to the detector at 510. Power can be supplied to the detector assembly either internally or from a remote location.

The present invention has been shown and described in what are considered to be the most practical and preferred embodiments. It his anticipated, however, that departures may be made therefrom and that obvious modifications will be implemented by those skilled in the art.

We claim:

1. An apparatus under the control of a surface operator for locating a utility conveyance beneath a body of water, comprising:

a submersible housing having a detector including:
   a first signal generator for impressing a conveyance-locating signal on the conveyance so that the conveyance radiates a first electromagnetic field;
   a second signal generator for impressing a conveyance-confirmation signal that is pulsed in a particular pattern unique to the conveyance to be located, so that the conveyance radiates a second electromagnetic field unique to the conveyance;
   a first signal detector for sensing where the first field is strongest to establish a region where the conveyance is generally located;
   a plurality of second detectors, each of the second detectors being capable of detecting the presence of the second field;
the submersible housing further including:
   ballast means for selectively controlling its buoyancy;
   means to maneuver the housing relative to a target search location; and
   a camera associated with the housing to capture images of a target search location; and
a surface control unit connected to the submersible housing detector, ballast means, maneuvering means and camera, including:
   processor means connected to the plurality of second detectors for vectoring the location of the conveyance in response to the presence of the second field detected at each of the second detectors;
   display means for displaying to the operator the images of the target search area captured by the camera and the location of the conveyance as determined by the processor means;
   means under the control of the operator to cause the submersible housing to be maneuvered relative to a target search area; and
   means under the control of the operator to change the buoyancy of the ballast means.

2. The apparatus recited in claim 1, wherein the surface control unit is connected to the submersible housing detector, ballast means and camera through an umbilical cable.

3. The apparatus recited in claim 1, wherein the means to maneuver the housing comprises a plurality of control cables attached to the housing to enable an operator to maneuver the housing relative to a target search location from the surface.

4. The apparatus recited in claim 1, further comprising a illuminating means for the camera to illuminate images of a target search location for capture by the camera.

5. The apparatus recited in claim 1, wherein the housing includes a plurality of legs.

6. The apparatus recited in claim 5, further comprising at least one weight attached to each leg.

7. An apparatus for locating a utility conveyance beneath a body of water, comprising:
a submersible housing including:
   ballast means associated with the housing for selectively controlling the buoyancy of the apparatus;
   a plurality of control cables attached to the housing to enable an operator to maneuver the housing relative to a target search location;
   a camera associated with the housing to direct images of a target search location to a remote operator; and
   a detector assembly including:
      a first signal generator for impressing a conveyance-locating signal on the conveyance so that the conveyance radiates a first electromagnetic field;

a second signal generator for impressing a conveyance-confirmation signal that is pulsed in a particular pattern unique to the conveyance to be located, so that the conveyance radiates a second electromagnetic field unique to the conveyance;

a first signal detector for sensing where the first field is strongest to establish a region where the conveyance is generally located;

a plurality of second detectors, each of the second detectors being capable of detecting the presence of the second field; and means connected to the plurality of second detectors for vectoring the location of the conveyance in response to the presence of the second field detected at each of the second detectors; and a surface control unit at the location of the remote operator and connected to the submersible housing including:
    a status indicator for indicating to the operator the location of the conveyance as determined by the detector assembly;
    a video display for displaying to the operator images of a target search location;
    means tinder the control of the operator for controlling the ballast means; and
    means for positioning the control cables.

8. The apparatus recited in claim 7 wherein the surface control unit is connected to the submersible housing through an umbilical cable arranged to transmit air to or from the submersible housing to control buoyancy.

* * * * *